(12) United States Patent
Witvrouw

(10) Patent No.: US 9,196,603 B2
(45) Date of Patent: Nov. 24, 2015

(54) METHOD FOR FLUID GUIDED SELF-ASSEMBLY OF MICROCOMPONENTS

(75) Inventor: Ann Witvrouw, Leuven (BE)

(73) Assignee: IMEC, Leuven (BE)

( * ) Notice: Subject to any disclaimer, the term of this patent is extended or adjusted under 35 U.S.C. 154(b) by 876 days.

(21) Appl. No.: 13/462,601

(22) Filed: May 2, 2012

(65) Prior Publication Data

US 2012/0285010 A1    Nov. 15, 2012

Related U.S. Application Data

(60) Provisional application No. 61/484,393, filed on May 10, 2011.

(30) Foreign Application Priority Data

May 10, 2011    (EP) ..................... 11165396

(51) Int. Cl.
*H05K 3/30* (2006.01)
*H01L 23/00* (2006.01)
*H05K 3/34* (2006.01)

(52) U.S. Cl.
CPC ................ *H01L 24/95* (2013.01); *H01L 24/50* (2013.01); *H01L 2224/29147* (2013.01); *H01L 2224/83192* (2013.01); *H01L 2224/95001* (2013.01);
(Continued)

(58) Field of Classification Search
CPC ......... H01L 24/50; H01L 24/86; H01L 24/95; H01L 25/50; H01L 2224/29147; H01L 2224/95001; H01L 2224/95085; H01L 2224/95146; H01L 2924/01029; H01L 2924/01033; H01L 2924/01005; H01L 2924/01006; H01L 2924/01075; H01L 2924/014; H01L 2224/83192; Y10T 29/53004; Y10T 29/4913; Y10T 29/49133; H05K 3/301; H05K 3/341
USPC .............. 29/830, 832, 834, 840; 438/30, 106; 977/883, 949
See application file for complete search history.

(56) References Cited

U.S. PATENT DOCUMENTS 7,080,444 B1    7/2006 Craig et al.
7,232,704 B2 *  6/2007 Singh ....................... H01L 24/95
                                          438/106

(Continued)

OTHER PUBLICATIONS

Boyack et al., "An Integral Solution for the Laminar Radial Outflow of a Viscous Fluid Between Parallel Stationary Disks", Journal of Basic Engineering, Sep. 1970, pp. 662-663.

(Continued)

*Primary Examiner* — Donghai D Nguyen
(74) *Attorney, Agent, or Firm* — Knobbe Martens Olson & Bear, LLP

(57) ABSTRACT

A method and apparatus is provided for self-assembly of micro-components such as microchips onto a carrier substrate, provided with assembly locations for the components. The components are supplied to the carrier by a liquid flow, while a template substrate is arranged facing the carrier. The template is a substrate provided with openings aligned to the assembly locations. The carrier and template are submerged into a tank filled with the liquid, while the liquid flow is supplied to the template side together with the components, so that the components are guided towards the openings by the flow of liquid. Once a component is trapped into an opening of the template, substantially no further liquid flow through the opening is possible, so that following components are guided towards the remaining openings, thereby establishing a fast and reliable self-assembly process.

10 Claims, 7 Drawing Sheets

(52) U.S. Cl.
CPC ............... *H01L2224/95085* (2013.01); *H01L 2224/95146* (2013.01); *H01L 2924/014* (2013.01); *H01L 2924/01005* (2013.01); *H01L 2924/01006* (2013.01); *H01L 2924/01029* (2013.01); *H01L 2924/01033* (2013.01); *H01L 2924/01075* (2013.01); *H05K 3/301* (2013.01); *H05K 3/341* (2013.01); *Y10T 29/4913* (2015.01); *Y10T 29/53004* (2015.01)

(56) References Cited

U.S. PATENT DOCUMENTS

| | | | |
|---|---|---|---|
| 7,251,882 B2* | 8/2007 | Ricks | H01L 23/345 29/840 |
| 7,727,788 B2* | 6/2010 | Han | H01L 24/95 977/883 |
| 2001/0031514 A1 | 10/2001 | Smith | |
| 2004/0063233 A1 | 4/2004 | Onozawa | |
| 2005/0164485 A1 | 7/2005 | Onozawa | |
| 2005/0214972 A1 | 9/2005 | Singh | |

OTHER PUBLICATIONS

Chung et al., "Guided and fluidic self-assembly of microstructures using railed microfluidic channels", Nature Materials, vol. 7, Jul. 2008, www.nature.com/naturematerials, Published online: Jun. 15, 2008; doi:10.1038/nmat2208.

Xiong et al., "Geometric Binding Site Design for Surface-Tension Driven Self-Assembly", Proceedings of the 2004 IEEE International Conference on Robotics & Automation, New Orleans, LA, Apr. 2004, pp. 1141-1148.

* cited by examiner

METHOD FOR FLUID GUIDED SELF-ASSEMBLY OF MICROCOMPONENTS

CROSS-REFERENCE TO RELATED APPLICATIONS

This application claims the benefit under 35 U.S.C. §119 (e) of U.S. provisional application Ser. No. 61/484,393, filed May 10, 2011, and claims the benefit under 35 U.S.C. §119 (a)-(d) of European Application No. 11165396.0, filed May 10, 2011, the disclosures of which are hereby expressly incorporated by reference in their entirety and are hereby expressly made a portion of this application.

FIELD OF THE INVENTION

Methods and apparatus related to the assembly of micro components (e.g. chips or other micro-electronic devices) onto a carrier substrate are provided.

STATE OF THE ART

Self-alignment/self-assembly of components with respect to carrier locations is known in the art. One known method is illustrated in FIG. 1a. As seen in FIG. 1a, the carrier substrate 1 is submerged in a liquid 2, preferably water. On the assembly locations designed to receive the components, a hydrophobic layer 3 is present (hydrophobic in the case of water used as the liquid 2). Outside of the assembly locations, a hydrophilic layer 4 is present on the carrier surface. A lubricant having substantially no solubility in the liquid 2, is added to the liquid, and forms regions 5 of the lubricant on the assembly locations. On the functional side of the components 6, a similar hydrophobic layer 7 is present, while on the opposite side 8, the component's surface is hydrophilic. Due to surface tension and capillary force-related effects, a component added to the liquid will align with an assembly location, as the hydrophobic layer 7 of a component becomes attracted to a lubricant region 5 (see FIG. 1b). Energy minimization will then result in a self-aligned state, shown in FIG. 1c, after which the assembly is finalized by drying and possibly heating steps in order to establish a permanent bond of the component to the carrier.

Presently known techniques which exploit the above-described self-alignment are limited to stochastic processes wherein a number of components are added to a liquid bath containing the carrier substrate. The time a component takes to achieve its final alignment starting from partial overlap with the site depends on the properties of the lubricant (interfacial energy, volume, density, and viscosity): it may range from fractions of a second to tens of seconds. The process is repeated until the desired fraction of the sites is asymptotically filled, or until the maximum allowed time-to-assembly is reached. Such a process is therefore time-consuming. Also, alignment errors may occur during the drying and heating steps, due to a disturbance of the low-energy state by outside forces (e.g. handling or moving the carrier substrate).

SUMMARY OF THE INVENTION

The embodiments relate to an apparatus and methods as disclosed herein, including a method for assembling microcomponents to a carrier substrate, the substrate being provided on at least one surface with assembly locations suitable for receiving the micro-components, through the alignment of a contact surface of a component with the surface of an assembly location, wherein:

a template substrate is placed facing the substrate surface comprising the assembly locations, the template comprising openings whose shape corresponds to the shape of the largest cross-section of the components taken parallel to the contact surface, the template being placed in an arrangement relative to the carrier substrate so that the openings are aligned with the assembly locations, and at a distance to the carrier which is smaller than the height of the components, the arrangement thereby forming a carrier side and a template side, the carrier and template, whilst remaining in the arrangement of the template relative to the carrier, are submerged in a liquid, and subsequently, the components are provided to the template side of the arrangement, together with a supply of the liquid directed at the template side, the supply of liquid generating a flow of the liquid from the template side through the openings.

According to an embodiment, the arrangement of the carrier and template is placed horizontally in a tank filled with the liquid, with the template side facing upwards, and wherein simultaneously with the supply of liquid, liquid is drained from the tank through one or more outlet openings in the tank.

According to an embodiment, the size of the openings may be such that once a component has become inserted in an opening, further flow through the opening is substantially inhibited.

According to an embodiment, all of the openings may be occupied by components, and the components may be permanently assembled to the carrier.

According to an embodiment, the liquid, after having flown out through the outlet opening(s), may be recirculated back towards the template side of the carrier/template arrangement.

According to an embodiment, the supply of liquid may be provided by a tube arranged to supply the liquid and the components to the template side of the arrangement.

According to an embodiment, the carrier/template arrangement is placed horizontally, and the tube is placed in a slanted position with respect to the arrangement.

According to a further embodiment, each of the assembly locations is provided with a lubricant that is not miscible with the liquid, wherein the contact surface of each assembly location has low affinity for the liquid and high affinity for the lubricant, and wherein likewise the contact surface of each component is provided with a layer that has low affinity for the liquid but high affinity for the lubricant.

According to an embodiment:
the template/carrier arrangement is placed in a tank (16) filled with the liquid, the tank being provided with a top cover that closes off the tank except for an inlet opening providing access to the interior of the tank, and the tank being further provided with an outlet opening,
liquid and components are supplied through a supply tube connected to the inlet opening,
liquid and possibly components flow out of the tank through the outlet opening,
liquid fills the totality of the tank while the liquid flow is taking place.

Also provided is an apparatus for performing the method of the embodiments, the apparatus comprising:
a tank configured to contain a liquid,
a means for holding a substrate/template arrangement in the tank,
supply means for supplying components and liquid simultaneously to the template side of the arrangement.
one or more outlets configured to drain liquid from the tank.

In an apparatus of one embodiment, the supply means may be a tube configured to supply liquid and components to the template side. The tube may further be provided with a rail system configured to supply components one by one to the template side. The tube may be placed in a slanted position with respect to the template side.

According to an embodiment, the apparatus further comprises a means to recirculate liquid drained by the outlet(s) back towards the supply means.

The apparatus may further comprise a means to recirculate components that have not become inserted in an opening, back towards the supply means.

According to an embodiment, the tank is provided with a top cover that, when mounted on the tank, closes off the tank except for an inlet opening providing access for liquid and components to the interior of the tank, and wherein the supply means is connected to the inlet opening.

DETAILED DESCRIPTION OF THE INVENTION

Figure 2:
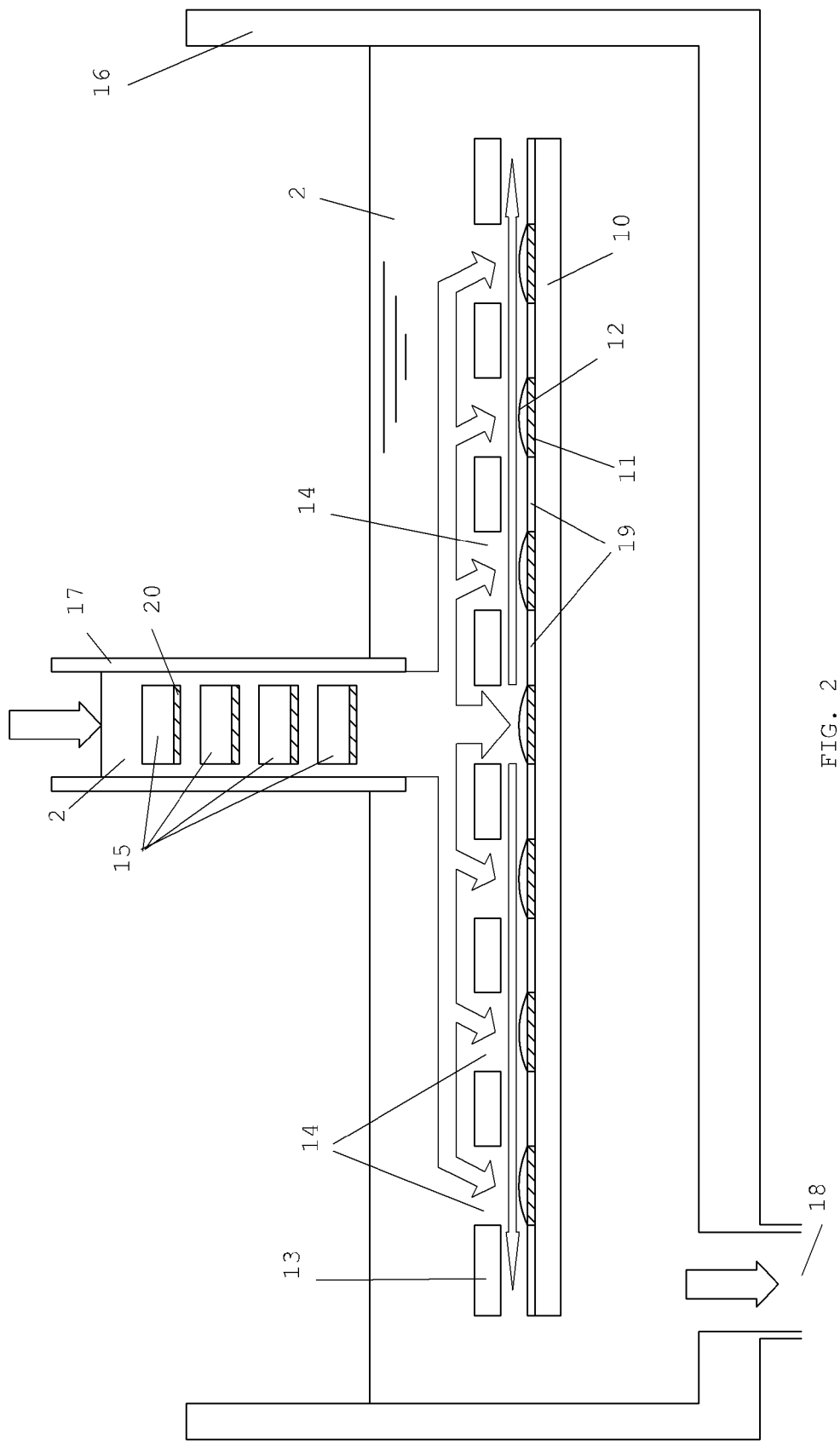
FIGS. 2 and 3a-b illustrate the method and apparatus of an embodiment.
Figure 3A:
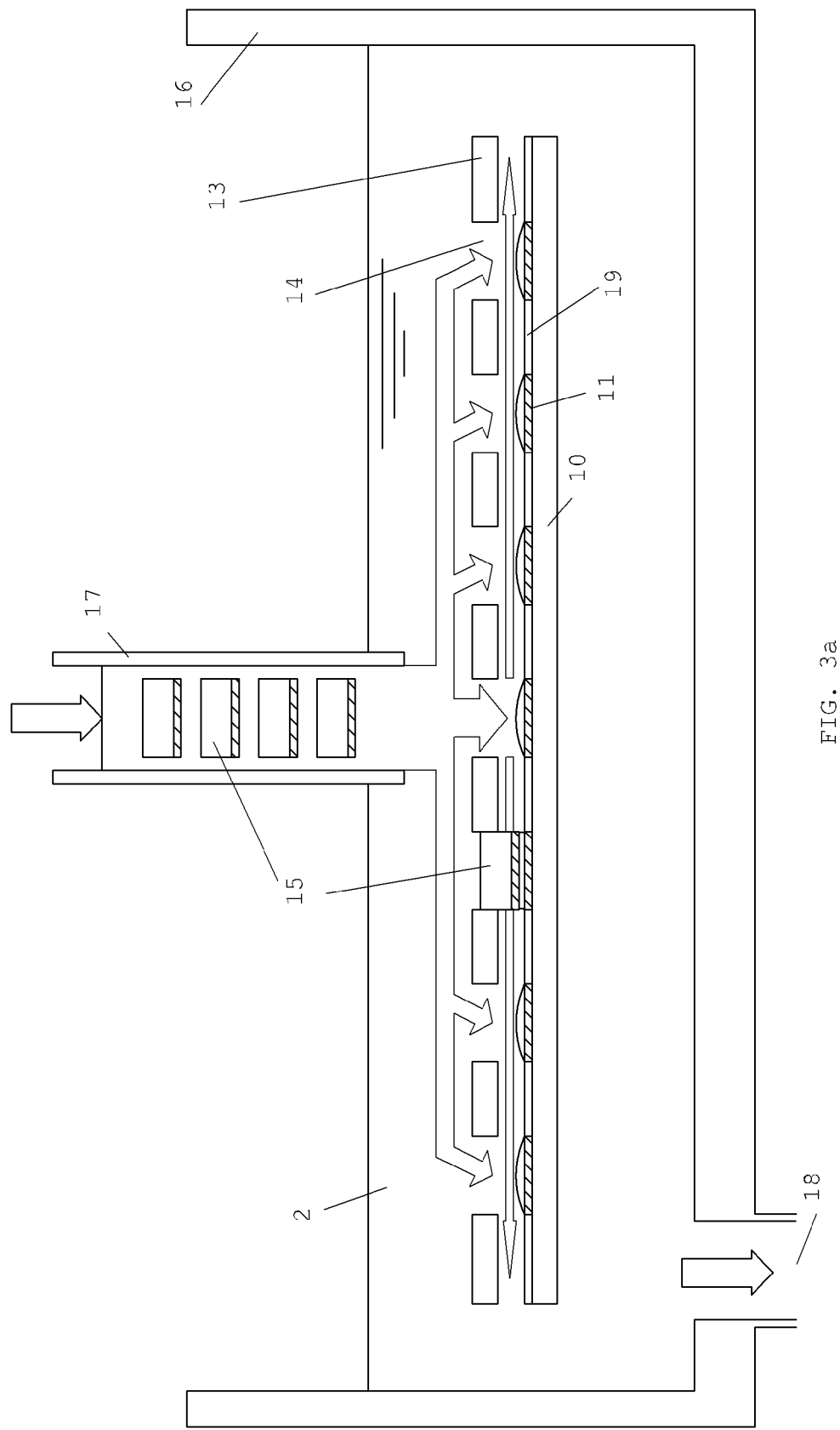
Figure 3B:
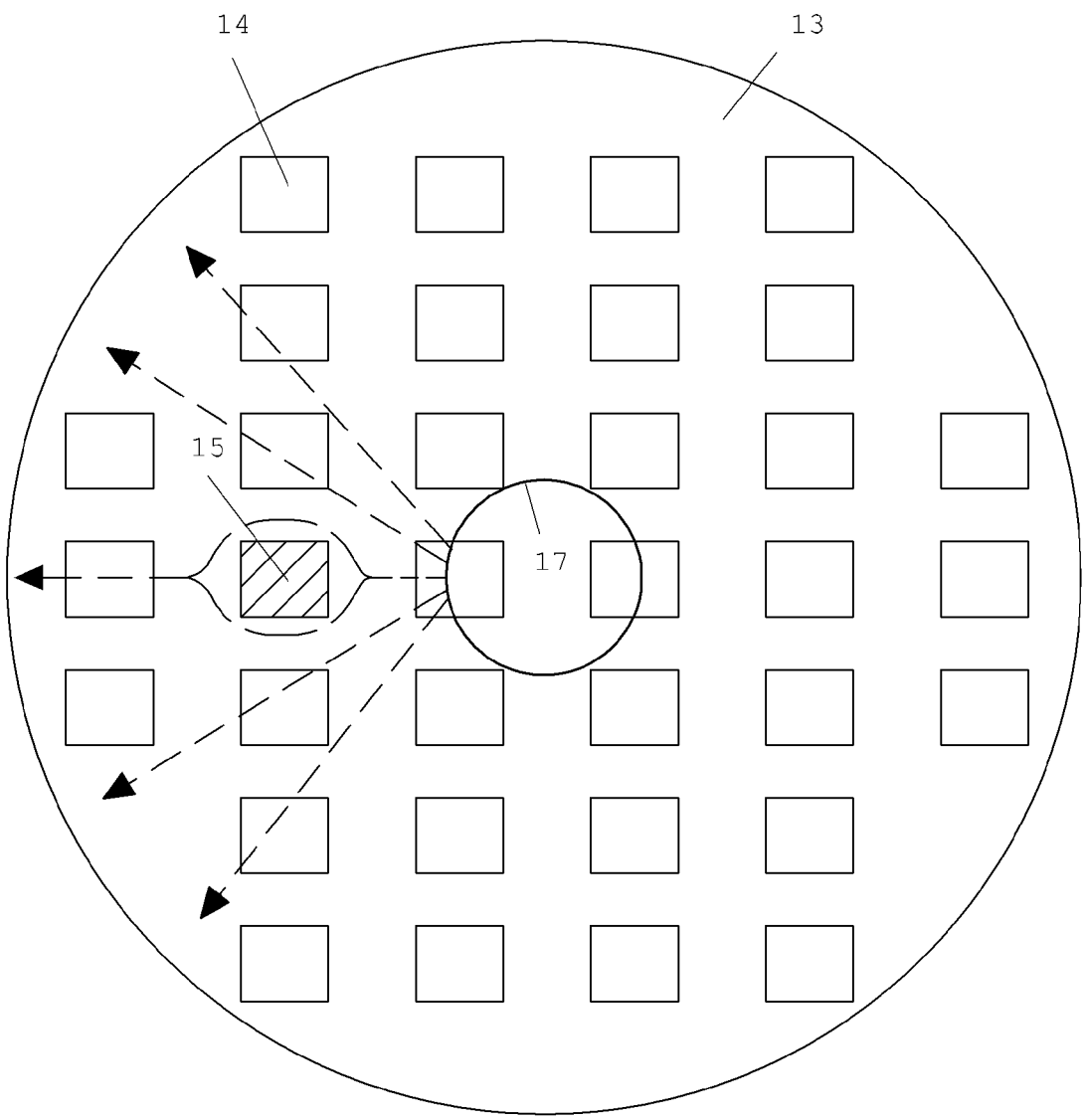

The embodiments related to a method for self-assembly of micro-components, primarily micro-electronic devices referred to as chips or dies, onto a carrier substrate, wherein the components are guided to their assembly locations by a liquid flow. The following description is based on the use of water as the liquid, though this is not a limitation to the embodiments' scope. FIGS. 2 and 3a-b illustrate an embodiment of the method and apparatus. The carrier substrate 10 is provided—as in the prior art—with hydrophobic layers 11 on the assembly locations, thereby defining the assembly locations 11, with a hydrophilic layer 19 covering the remainder of the substrate surface. Also as in the prior art, lubricant regions 12 are provided on the assembly locations. In the method of the embodiments, a template substrate 13 is placed in the vicinity of the carrier substrate, one surface of the template substrate facing, e.g., placed opposite but not in contact with the surface of the carrier where the assembly locations 11 are present. The template 13 is preferably essentially parallel to the carrier substrate, as shown in the embodiment of FIG. 2.

The template 13 can be a substrate of the same size as the carrier substrate. The template is provided with openings 14 whose shape (as seen in a plane parallel to the template 13) corresponds to the shape of the largest cross-section of the components which are to be assembled, while the size of the openings 14 is slightly larger than the size of the largest cross-section, so that a component 15 can easily pass through an opening 14. The cross-section is taken parallel to the contact surface 20 of the components, e.g., the surface by which the components are to be assembled to an assembly location. However the openings 14 are not so large as to permit a substantial lateral movement of the component when it is present in an opening. Another way of defining the size relation refers to the liquid used for the self-assembly according to the embodiments (see further). When a component is trapped into an opening with the contact surface 20 of the component facing the assembly location 11, further liquid flow through the opening is substantially inhibited. According to an embodiment, the surface area of an opening 14 is about 5% larger in size than the surface area of the largest cross-section of a component 15. Several sizes of components can be assembled by the method of the embodiments, ranging from very small components with their largest dimension equal to, e.g., 200 μm, to large dies with their largest dimension equal to, e.g., 0.5-2 cm. The number of openings 14 in the template can be the same as the number of component locations 11 on the carrier 10. Alternatively there can be a difference between the number of assembly locations 11 and the number of openings 14, for example for self-assembling two types of components. In that case, one template can be used for each component type.

In the method of the embodiments, the template 13 is aligned with the carrier 10 so that the openings 14 are aligned with the assembly locations 11. The carrier 10 and the template 13 are maintained at a fixed mutual distance, the distance being smaller than the height of a component 15. While being maintained at the distance, the template and carrier are submerged in a tank filled with a liquid 2, preferably water. Then a plurality of components 15 is supplied, preferably one by one, to the tank through a suitable supply device, such as a tube 17.

The components 15 are supplied on the template side of the template/carrier arrangement, e.g., above the template in the preferred case shown in FIG. 2, wherein the carrier 10 and template 13 are placed horizontally in the tank 16. The components 15 are preferably supplied to the centre of the template or to an area close to the centre of the template. The supply device, in the case of FIG. 2 the tube 17, is configured to supply a stream of liquid (the same liquid as the one in the tank) to the tank, together with the components 15, which are equally supplied through the tube 17. This liquid supply causes a flow of liquid generally indicated by the arrows in FIG. 2, e.g., from a central location above the template outwards towards the edge of the template/carrier arrangement and passing through the openings 14 of the template. For this purpose, the distance between the template 13 and the carrier 10 must be large enough to allow a significant liquid flow through the space between the carrier and the template.

Simultaneously with the supply of liquid, and in order to ensure the indicated flow of liquid, liquid streams out of the tank via one or several outlets 18, preferably located underneath the template/carrier arrangement. From the outlet 18, the liquid may be recirculated towards the liquid supply tube 17, via a suitable pump system (not shown).

In order for at least a portion of the liquid flow to follow the path indicated by the arrows, the liquid needs to be supplied to the tank at a suitable overpressure at the entrance of the tube 17 combined with a suitable underpressure in the outlet 18. These pressures may be created by suitably configured pumping devices, possibly in combination with a pre-defined pressure of the atmosphere above the surface of the liquid present in the tank and/or in combination with locally applied gas or liquid streams above the template or locally created underpressure areas beneath the template, which force the components to follow a path through the openings 14.

Figure 4:
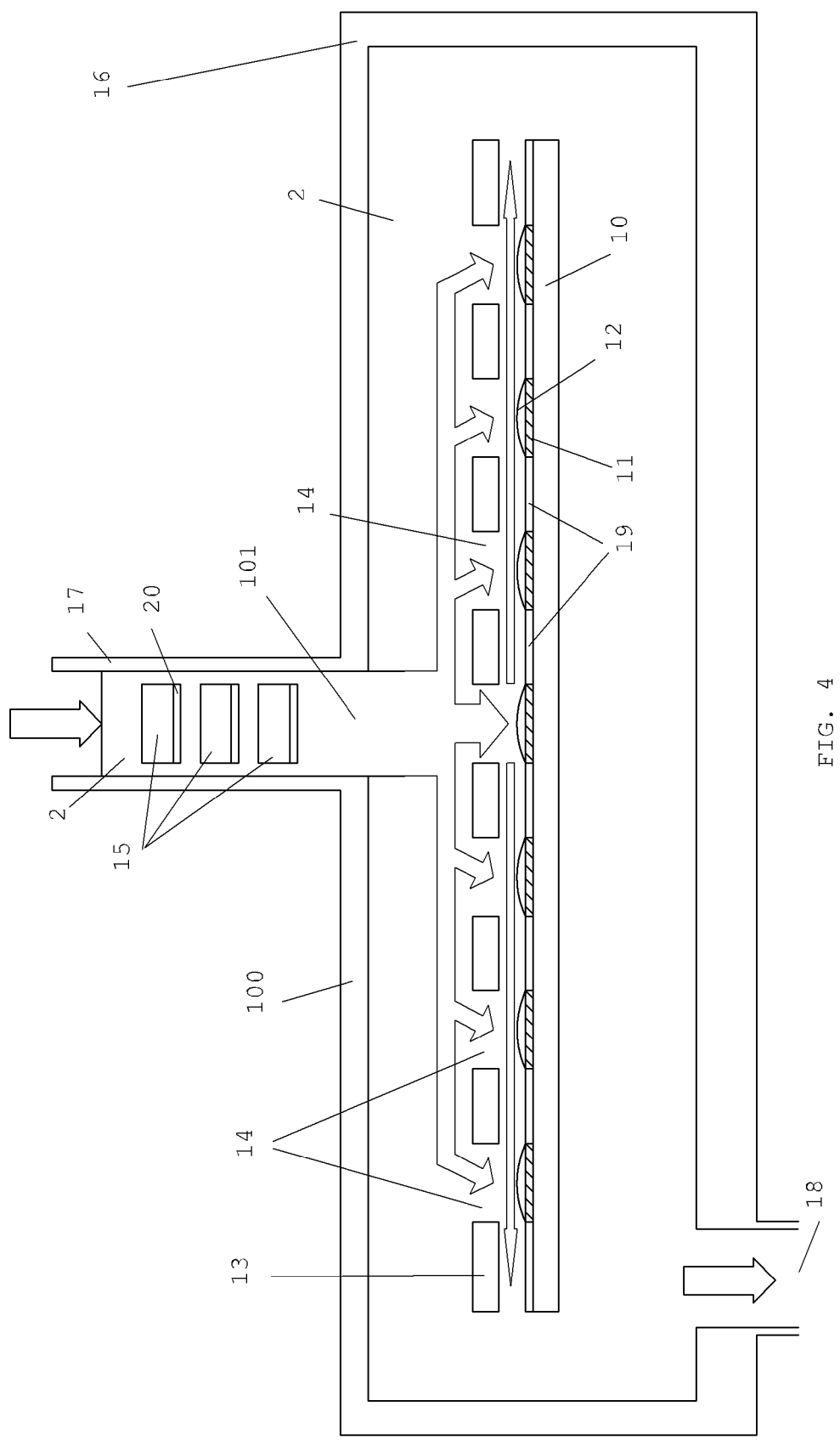
FIG. 4 illustrate a particular embodiment of the method and apparatus.
Figure 5A:
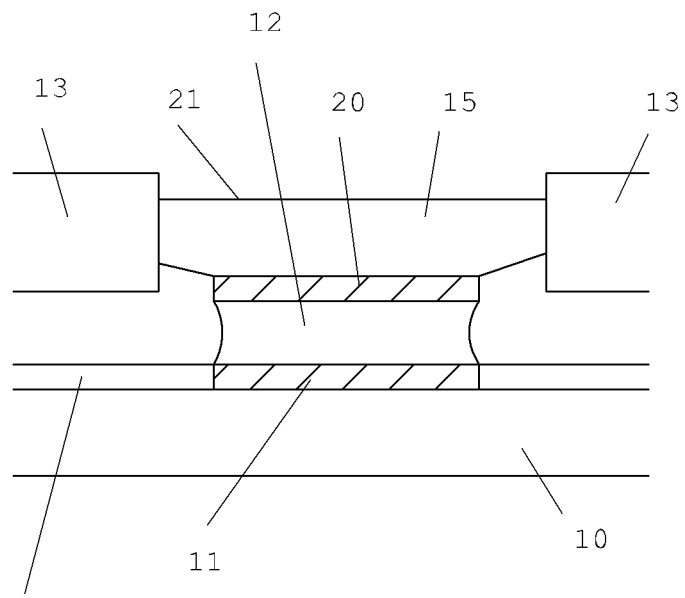
FIGS. 5a-b show a specific shape of a component which can be self-assembled by the method of an embodiment.
Figure 5B:
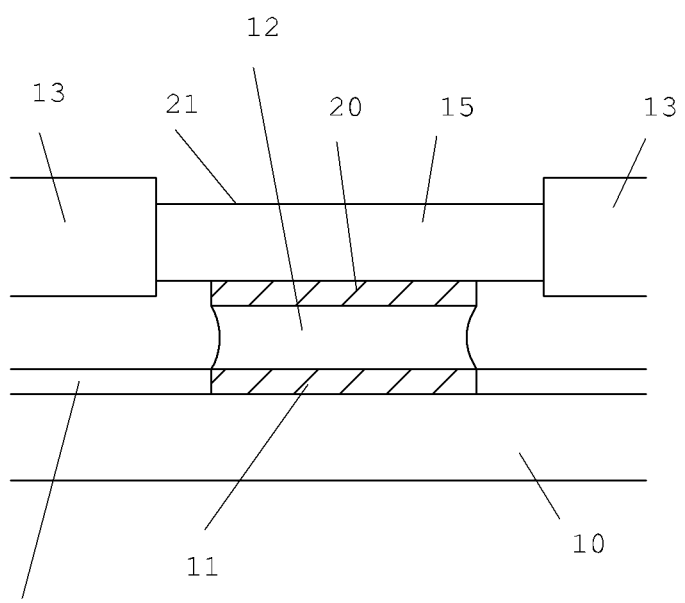

The tank may be open to the atmosphere as shown in FIGS. 2 and 3a-b, or it may be closed off by a cover 100, as shown in the embodiment of FIG. 4. The cover is provided with an inlet opening to which the tube 17 is connected. When using the apparatus of FIG. 4, the method may take place under atmospheric pressure, wherein the pressure difference between the inlet 17 and the outlet 18 is obtained only by the weight of the liquid column in the tube 17. As shown later in a detailed example of this embodiment, it is possible under these conditions to obtain the desired flow path (e.g. at least partially through the holes 14 of the template 13). The liquid supply is controlled so that the totality of the tank remains filled (e.g. up to the cover 100) while the liquid flow is taking place from the inlet 17 to the outlet 18. The cover 100 is preferably a removable cover which can be attached in a liquid-tight way to the tank 16.

When a component 15 is supplied in this way, it is transported by the liquid flow along the trajectory of the liquid flow and thus guided along the upper surface of the template 13, until it becomes caught in an opening of the template, see FIG. 3a. The components are provided as in the prior art with a hydrophobic layer 20 on their contact surface, and a hydrophilic layer on the opposite surface, which will establish the above described self-alignment to take place, while the component remains within the constraints defined by the opening 14. When the first component is in place, the liquid flow through the opening is substantially blocked as illustrated again by the arrows shown in FIG. 3a. In between the template and carrier, the flow takes place around the inserted component, as illustrated in the top view of FIG. 3b (only the flow to the left of the tube 17 is illustrated by arrows). The insertion of one component 15 in an opening 14 increases the probability of subsequent components being guided towards unblocked openings in the template. This process is repeated until all of the assembly locations 11 are provided with components 15.

According to the embodiment shown in FIGS. 2 and 3a-b, the outlet 18 is suitable for receiving also components 15 which have failed to become caught in an opening 14. The components may then be gathered from the outlet 18, e.g., by a suitable filter system and re-introduced in the inlet tube 17. Alternatively, the components may be automatically recirculated towards the inlet tube 17 along with the recirculated guiding liquid.

When all of the openings 14 have received a component 15, the carrier/template arrangement is taken out of the tank 16, or the liquid level lowered in the tank, and the components are permanently bonded to the carrier 10 by known drying and possibly heating steps. Advantageously, the template may be kept in place during the steps, which reduces the chance of misalignment errors occurring during the process steps.

The tube 17 can be placed vertically or in a slanted position. The supply of components 15 inside the tube is preferably done by a mechanical system arranged in the tube, which allows the components to be supplied one by one, either by manually releasing subsequent components or by releasing the components automatically with predefined time intervals between subsequent components. The mechanical system may be a rail system similar to systems known in the art. A supply tube positioned in a slanted position is advantageous in that it increases the probability of components remaining in the correct orientation, e.g., with the contact surface 20 facing downwards, while moving along the template surface.

Figure 6:
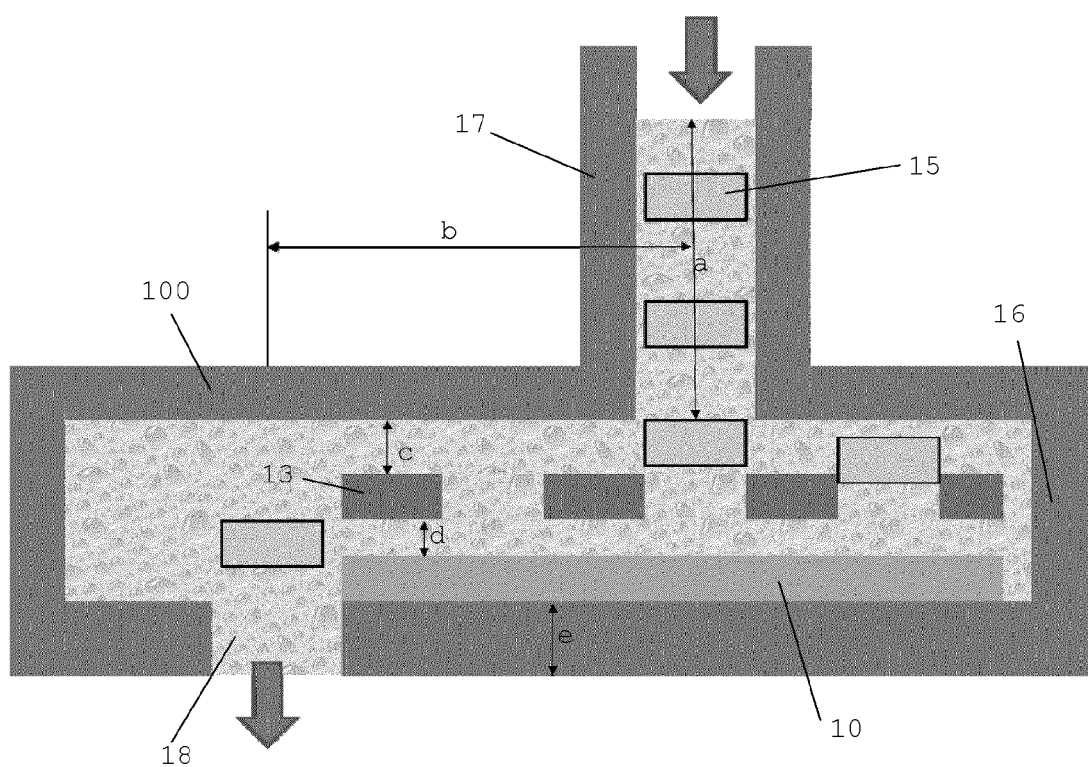
FIG. 6 illustrates a specific example of a method and apparatus according to an embodiment.

An apparatus of the embodiments comprises the following elements:
- a tank 16 configured to contain a liquid 2,
- a means for holding a substrate/template arrangement (10/13) in the tank (not shown in the drawings). This may be any type of known holding means for holding a substrate and template in a predefined position. According to an embodiment, the tank 16 itself is part of the holding means, e.g., the substrate and template are placed on the bottom of the tank, as illustrated in the example of FIG. 6. In this case, a suitable attachment means is provided for maintaining the substrate in a fixed position on the bottom of the tank, and for maintaining the template at a fixed distance to the substrate.
- a supply means 17 for supplying components 15 and liquid 2 simultaneously to the template side of the arrangement.

The apparatus further comprises one or more outlets 18 provided in the tank, and possibly a recirculation means (not shown) for recirculating liquid flowing out of the tank back towards the supply means 17. The recirculation means may also be suitable for recirculating components back towards the supply means. Alternatively, the outlet opening(s) 18 may be provided with means for filtering components, or separate outlets could be present for gathering and possibly recirculating components which have not been assembled. Any description given with respect to the methods of the embodiments of elements of the apparatus (e.g. position of the tube, rail system), are relevant for the description of the apparatus as such.

Figure 1A:
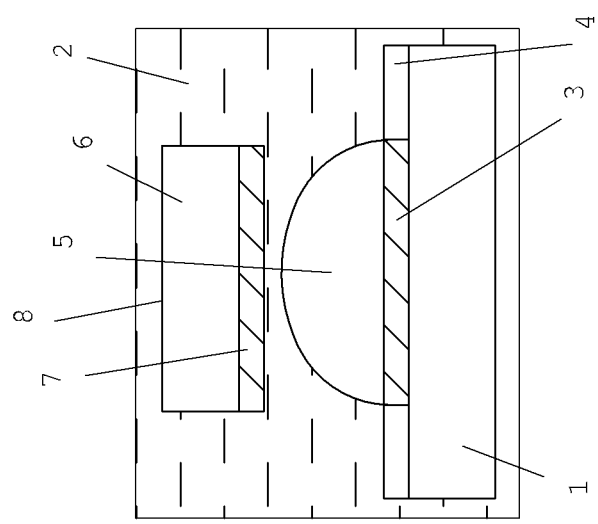
FIGS. 1a-c illustrate the principle of self-alignment of a component, as known in the art.
Figure 1B:
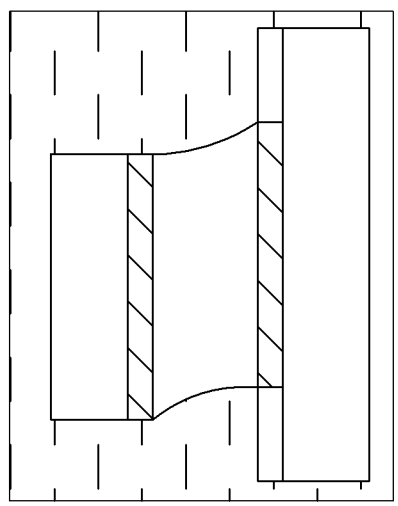
Figure 1C:
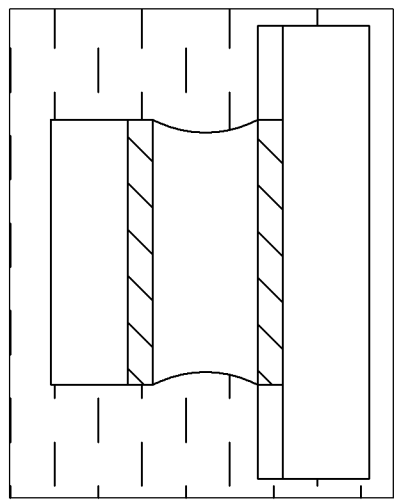

The embodiments are not limited to the embodiments described above and shown in the drawings. The guiding liquid can be any suitable liquid other than water, and a suitable lubricant can be chosen that shows the same behavior as described above in combination with the guiding liquid. Or water can itself be used as the lubricant, with a guiding liquid that is not miscible with water, and in combination with a hydrophilic layer on the assembly locations 11. Another alternative is to apply a coating of solder material (e.g. molten copper) on the assembly locations by a dip coating technique, and then apply the method of the embodiments with a guiding liquid having a boiling point above the melting point of the solder, applied at a temperature above the melting temperature of the solder material. Any known self-assembly principle can be used in stead of the one illustrated in FIG. 1, e.g., self-assembly on the basis of electric or magnetic field effects.

According to a particular embodiment, the self-assembly takes place only through the application of the template, e.g., by guiding the components over the template surface until they become trapped in an opening 14, and without a means for self-alignment such as the hydrophobic layer 11 and lubricant. In this case the height of template is preferably higher in order to ensure that the component remains trapped in the opening, and the difference in surface area between an opening and a component is preferably as small as possible in order to ensure an optimal alignment.

The liquid could be supplied through a separate supply means, different from the supply means for providing the components, e.g., one tube for the liquid and another tube for the components, both being directed at the template side of the carrier/template arrangement.

It is to be noted that the area and shape of the contact surface 20 and the assembly location 11 need not correspond to the area and shape of the largest cross-section 21 of a component. It is possible that the contact surface 20 of a component is smaller than the largest cross-section 21 of the component, as illustrated in FIGS. 4a and 4b. In the embodiment of FIG. 4, the lower surface 22 of the component is flat, and a hydrophobic layer 20 is applied on only a portion of the flat lower surface 22. The hydrophobic layer 20 hereby defines the contact surface of the component 15. The terms 'hydrophobic' and 'hydrophilic' have been used with reference to the embodiment with water as the guiding liquid, but this is not limiting to the scope of the embodiments. A hydrophobic surface is merely an example of a surface with low affinity for the guiding liquid, whereas a hydrophilic surface is an example of a surface with high affinity for the guiding liquid.

The material of the template 13 may be a semiconductor material, e.g. silicon, or glass or metal, or any other material suitable for the template's purpose. The number of openings on a template may vary depending on the application (from a few to several thousands). Likewise the size of the openings may vary between broad limits (for example 100 nm to a few centimeters for one dimension of the opening).

EXAMPLE

FIG. 6 shows an apparatus according to an embodiment configured for performing the method of an embodiment on an 8-inch semiconductor wafer 10, attached to the bottom of the tank 16, with the template 13 at a fixed distance to the wafer's surface. The dimensions a to e are as follows:
a=10 cm; b=114.6 mm (4 inches+13 mm); c=1 mm; d=0.6 mm; e=1 cm.

The liquid in the tank 16 is water. The tank is provided with a cover 100 as described previously. The water is supplied to the tank through inlet tube 17. Water is supplied to the tube 17 in such a way that the water level in the tube remains substantially constant, and that the tank 16 remains filled up to the cover 100 through the process. Components 15 are supplied to the tank through the tube 17. The components have a square cross-section of $9.96 \times 9.9$ mm$^2$, and a thickness of 0.75 mm. The template 13 is provided with 50 holes of square cross-section ($10 \times 10$ mm$^2$). The thickness of the template is 0.75 mm. The outlet hole has a square cross section of $14.5 \times 14.5$ mm$^2$. Water and possibly components exiting the tank 16 through the outlet 18 may be pumped back to the inlet 17 (while leaving the water column in the inlet tube 17 open to the atmosphere). The tank is placed in air under atmospheric conditions. The flow of the water through the apparatus is generated by the pressure exerted through the 10 cm water column present in the tube 17.

Water exiting the tube 17 will flow through the holes of the template or directly to the outlet via the space between the template and the cover 100 of tank. These two flow paths are thus forming parallel connections between the inlet tube 17 and the outlet 18. A rough calculation was made of the flow resistance of both paths, which led to an estimation of the total flow through the apparatus, and of the relative portion of the flow that is passing through the holes of the template. It was found that the total flow of water through the apparatus is about 0.049 m$^3$/s and that about 0.03 m$^3$/s is flowing through the holes of the template when none of the holes is filled with a component, e.g. more than half of the water flow goes through the holes of the template. The rest of the water flows directly to the outlet through the space between the template and the cover 100 of tank 16. When 50% of the holes are filled, the water flow through the remaining holes does not substantially change. When only one of the holes is not filled by a component, the water flow through the remaining holes of the template is still about 0.028 m$^3$/s. In other words, as the components are filling up the holes of the template, a sufficient water flow trough the remaining holes is maintained so that all of the holes may be filled with components.

While the disclosure has been illustrated and described in detail in the drawings and foregoing description, such illustration and description are to be considered illustrative or exemplary and not restrictive. The disclosure is not limited to the disclosed embodiments. Variations to the disclosed embodiments can be understood and effected by those skilled in the art in practicing the claimed disclosure, from a study of the drawings, the disclosure and the appended claims.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

Where a range of values is provided, it is understood that the upper and lower limit, and each intervening value between the upper and lower limit of the range is encompassed within the embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

What is claimed is:

1. A method for assembling micro-components on a carrier substrate, comprising:

placing a template substrate facing a surface of a carrier substrate to yield a carrier template arrangement, wherein the carrier substrate comprises a plurality assembly locations, each configured for receiving a micro-component, wherein the template comprises openings whose shape corresponds to a shape of a largest cross-section of the micro-component to be received taken parallel to a contact surface of the micro-component, wherein the template is placed in an arrangement relative to the carrier substrate such that the openings are aligned with the assembly locations, and at a distance from the carrier substrate that is smaller than a height of the micro-component to be received, wherein the carrier template arrangement has a carrier side and a template side;

submerging the carrier template arrangement in a liquid; and thereafter providing a plurality of the micro-components to the template side of the carrier template arrangement, together with a supply of the liquid directed at the template side, the supply of liquid generating a flow of the liquid from the template side through the openings and a space between the carrier substrate and the template substrate, the flow guiding the micro-components towards the openings, such that the micro-components become inserted in the openings, whereby the contact surface of each micro-component is aligned with a contact surface of a corresponding assembly location.

2. The method according to claim 1, wherein a size of the openings is such that once the micro-component has become inserted in an opening, further flow of liquid through the opening is substantially inhibited.

3. The method according to claim 1, wherein each of the openings is occupied by a micro-component and/or wherein each of the micro-components is permanently assembled to the carrier.

4. The method according to claim 1, further comprising placing the carrier template arrangement horizontally in a tank filled with the liquid, with the template side facing upwards, and wherein simultaneously with the supply of the liquid, liquid is drained from the tank through one or more outlet openings in the tank.

5. The method according to claim 4, wherein the liquid, after flowing out through the one or more outlet openings, is recirculated back towards the template side of the carrier template arrangement.

6. The method according to claim 1, wherein the supply of the liquid is provided by a tube configured to supply the liquid and the micro-components to the template side of the carrier template arrangement.

7. The method according to claim 6, wherein the carrier template substrate arrangement is placed horizontally, and wherein the tube is placed in a slanted position with respect to the carrier template arrangement.

8. The method according to claim 1, wherein each of the assembly locations is provided with a lubricant that is not miscible with the liquid, wherein the contact surface of each assembly location has a low affinity for the liquid and a high affinity for the lubricant, and wherein the contact surface of each micro-component is provided with a layer that has a low affinity for the liquid and a high affinity for the lubricant.

9. The method according to claim 1, wherein the carrier template arrangement is placed in a tank filled with the liquid, the tank having a top cover that closes off the tank except for an inlet opening configured to provide access to an interior of the tank, and the tank further having an outlet opening; wherein the liquid and the micro-components are supplied through a tube connected to the inlet opening; wherein the liquid flows out of the tank through the outlet opening; and wherein liquid fills a totality of the tank while the liquid flow is taking place.

10. The method according to claim 9, wherein one or more micro-components flow out of the tank through the outlet opening.

* * * * *

UNITED STATES PATENT AND TRADEMARK OFFICE
CERTIFICATE OF CORRECTION

| | | |
|---|---|---|
| PATENT NO. | : 9,196,603 B2 | Page 1 of 1 |
| APPLICATION NO. | : 13/462601 | |
| DATED | : November 24, 2015 | |
| INVENTOR(S) | : Ann Witvrouw | |

It is certified that error appears in the above-identified patent and that said Letters Patent is hereby corrected as shown below:

In the Specification

In column 4 at line 24, Before "filled" insert --16--.

In column 5 at line 14, Before "of" insert --14--.

In column 7 at line 29, Change "9.96x9.9" to --9.9x9.9--.

In column 9 at line 18, After "e.g.," insert --"a"--.

In the Claims

In column 10 at line 8, In Claim 1, change "carrier template" to --carrier-template--.

In column 10 at lines 19-20, In Claim 1, change "carrier template" to --carrier-template--.

In column 10 at line 22, In Claim 1, change "carrier template" to --carrier-template--.

In column 10 at line 25, In Claim 1, change "carrier template" to --carrier-template--.

In column 10 at line 44, In Claim 4, change "carrier template" to --carrier-template--.

In column 10 at lines 51-52, In Claim 5, change "carrier template" to --carrier-template--.

In column 10 at lines 55-56, In Claim 6, change "carrier template" to --carrier-template--.

In column 10 at lines 57-58, In Claim 7, change "carrier template substrate" to --carrier-template--.

In column 10 at line 60, In Claim 7, change "carrier template" to --carrier-template--.

In column 11 at lines 1-2, In Claim 9, change "carrier template" to --carrier-template--.

Signed and Sealed this
Fourteenth Day of June, 2016

Michelle K. Lee
*Director of the United States Patent and Trademark Office*